United States Patent [19]
Bahr et al.
[11] 3,742,396
[45] June 26, 1973

[54] GRATING SURFACE ACOUSTIC WAVE TRANSDUCER

[75] Inventors: Alfred J. Bahr, Mountain View; Allen F. Podell, Palo Alto, both of Calif.

[73] Assignee: Stanford Research Institute, Menlo Park, Calif.

[22] Filed: July 23, 1971

[21] Appl. No.: 165,655

[52] U.S. Cl. .......................... 333/30, 310/9.8, 333/72
[51] Int. Cl. ........ H03h 7/30, H03h 9/02, H03h 9/32
[58] Field of Search .................................. 333/30, 72; 310/8–8.3, 9.8

[56] References Cited

UNITED STATES PATENTS

| | | | |
|---|---|---|---|
| 3,568,102 | 7/1967 | Tseng | 333/30 |
| 3,518,582 | 6/1970 | Pizzarello | 333/30 |
| 3,626,309 | 12/1971 | Knowles | 329/117 |
| 3,543,058 | 11/1970 | Klemens | 333/30 |
| 3,506,858 | 4/1970 | Shaw | 333/30 |
| 3,626,334 | 12/1971 | Keyes | 333/30 |
| 2,711,515 | 6/1955 | Mason | 333/30 R |
| 2,714,708 | 8/1955 | Howatt et al. | 333/30 R |
| 3,289,114 | 11/1966 | Rowen | 333/71 X |
| 3,479,572 | 11/1969 | Pokorny | 333/72 X |
| 3,568,102 | 3/1971 | Tseng | 333/30 |
| 3,686,518 | 8/1972 | Hartmann et al. | 333/30 X |

*Primary Examiner*—Rudolph V. Rolinec
*Assistant Examiner*—Marvin Nussbaum
*Attorney*—Lindenberg, Freilich & Wasserman

[57] ABSTRACT

A transducer for exciting and/or detecting surface acoustic waves at both UHF and microwave frequencies in piezoelectric materials comprises a plurality of parallel spaced conductors deposited on the surface of the piezoelectric material.

4 Claims, 4 Drawing Figures

PATENTED JUN 26 1973 3,742,396

INVENTORS
ALFRED J. BAHR
ALLEN F. PODELL
BY Lindenberg, Freilich & Wasserman
ATTORNEYS

GRATING SURFACE ACOUSTIC WAVE TRANSDUCER

BACKGROUND OF THE INVENTION

This invention relates to surface acoustic wave transducers for use in the UHF and microwave frequency region, and more particularly to improvements therein.

Considerable research and development work has been carried out on techniques for propagating surface acoustic waves at VHF and UHF frequencies in single crystal piezoelectric materials. The use of piezoelectric material insures that a surface acoustic wave carries along an associated electric field enabling the wave to be readily sampled or tapped at any point along its propagation path. The presence of this electric field has allowed a wide range of functional components to be realized both for frequency filtering and, more significantly, for time-domain signal processing. The key to these realizations has been a metal electrode interdigital transducer comprising an "alternate phase" grating, which is modified for special applications by techniques such as grading the periodicity of the grating, grading the electrode overlap distance and forming linear arrays of spatially separated wide band transducers.

In spite of the great utility of the interdigital transducer, it has not been used a great deal at frequencies above 1 GHz. This has been primarily because of the difficulty in fabricating such high frequency interdigital transducers. The very small dimensions involved require the use of electron beam micromachining techniques. The scanning electron microscope has been used successfully for this purpose and transducers operating at frequencies as high as 3 GHz have been fabricated. However, the fabrication of these particular transducers required the use of a very stable and expensive scanning electron microscope that is not commercially available. Moreover, at 3 GHz and above, the real part of the input impedance of an interdigital transducer becomes quite low (a few ohms or less) and the transducer begins to exhibit noticeable amounts of resistance and inductance in the fingers which comprise its structure. Thus, microwave interdigital transducers are not only very expensive and difficult to make but are also inherently lossy. In addition, a single short circuit between any pair of fingers renders an interdigital transducer inoperable.

OBJECTS AND SUMMARY OF THE INVENTION

An object of this invention is to provide a surface acoustic wave transducer which can be used at microwave frequencies and yet is simple to fabricate.

Another object of this invention is to produce a surface wave acoustic transducer for use at UHF and microwave frequencies wherein the real part of its input impedance is substantial over a wider range of frequencies than previously known transducers of this type and wherein the finger resistance and inductance at these frequencies is minimal.

Still another object of this invention is to produce a surface wave acoustic transducer which will remain operative despite a short between adjacent fingers or breaks in any of the fingers.

Yet another object of this invention is the provision of a novel and useful transducer for generating and detecting surface acoustic waves.

The foregoing and other objects of the invention are achieved in a construction wherein the transducer is formed of spaced parallel conductors which are deposited on the surface of the piezoelectric material. The width of each conductor may be made equal to one half an acoustic wavelength at the frequency of operation and the spacing between two adjacent conductors may be equal to one half acoustic wavelength. The length of each conductor is determined by the required impedance level for the transducer. The maximum conductor length is limited by the size of the piezoelectric substrate, and the minimum length of conductor is determined by the allowable diffraction loss.

Propagation of the acoustic wave occurs in a direction perpendicular to the long dimension of the parallel spaced conductors. Input to the transducer may be applied to the first and last of the parallel spaced conductors. An output may be derived from the first and the last of the parallel spaced conductors.

The novel features of the invention are set forth with particularity in the appended claims. The invention will best be understood from the following description when read in conjunction with the accompanying drawings.

DESCRIPTION OF THE PREFERRED EMBODIMENT

Figure 1:
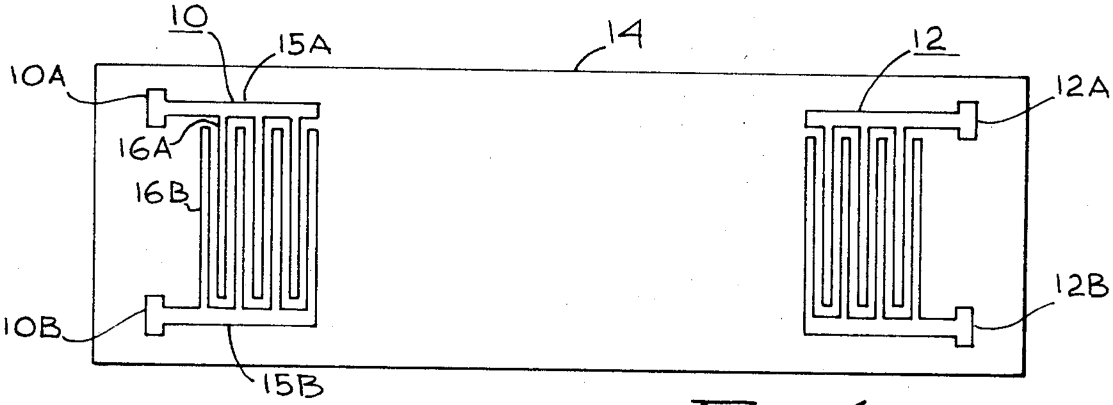
FIG. 1 is a view in elevation of a interdigital surface acoustic wave transducer of the prior art.

FIG. 1 shows a pair of the presently known interdigital transducers respectively 10, 12, which are deposited on a single crystal piezoelectric bar 14. This is shown in order to afford an appreciation and better understanding of the present invention. Each transducer has input terminals respectively 10A, 10B, 12A, 12B, which also are used as output terminals. The spacing between the fingers 16A, 16B, is made smaller, as well as the fingers themselves, as the frequency at which the transducer is to be employed, is increased. It will be noted that the interdigital transducer consists of two spaced parallel conductors 15A, 15B, from which the respective fingers 16A and 16B extend toward each other and interlace.

It was previously indicated that besides the difficulty in construction of interdigital transducers for operation at frequencies extending upward from 1 GHz, the real part of the input impedance of the interdigital transducer becomes quite low, since the coupling gaps between the extending fingers are in parallel. Also, with increasing frequency, the resistance and inductance caused by the fingers in the interdigital transducer increases markedly. A single short circuit between any pair of fingers in the interdigital transducer renders that transducer inoperable.

Figure 2:
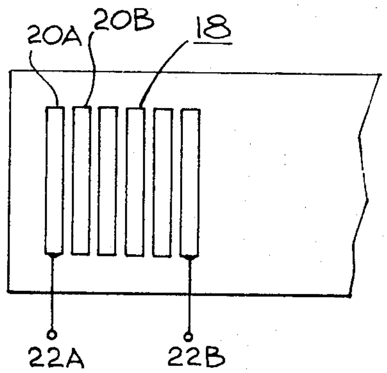
FIG. 2 is a view in elevation of grating surface acoustic wave transducer exemplifying this invention.

Referring now to FIG. 2, there may be seen a view in elevation of a transducer, called a grating transducer, in accordance with this invention. This transducer 18 comprises a plurality of parallel spaced conductors 20A, 20B, by way of example, which are one half acoustic wavelength or multiple thereof at the operating frequency in width, are spaced one half wavelength at this frequency apart and are deposited on the surface of a piezoelectric crystal. The first and last conductors of the transducer may constitute the input and output terminals 22A, 22B.

A voltage applied to the two terminals produces an electric field across each gap by virtue of the capacity that exists between adjacent bars. At any instant of time the fields and all the gaps are in phase, since the array is much smaller than an electromagnetic wavelength. It is noteworthy also that, in contrast in a conventional "single phase" grating the potential on each finger of the array is different. The interdigital transducer is an alternate phase grating. Spacing the gaps between the fingers of the grating transducer as shown in FIG. 2, by a surface acoustic wavelength, or a multiple thereof, causes cumulative surface wave generation to take place.

Acoustically, the grating transducer operates much like an interdigital transducer except that the minimum spacing between coupling gaps is one wavelength instead of one-half wavelength. Electrically, however, the coupling gaps are in series for the grating transducer, while for the interdigital transducer they are in parallel. Thus it is clear that the input impedance for the grating transducer is much higher than for an interdigital array. In fact, at UHF frequencies the input impedance of a simple grating transducer is too high for it to be usable. To obtain usable impedance levels at these frequencies, several grating transducers must be connected in parallel. At microwave frequencies, however, the real part of the input impedance of a grating transducer can be on the order of 50 ohms. The importance of this higher impedance lies in the fact that it greatly facilitates the realization of good low loss matching networks.

Another important feature of the grating transducer is the pattern of current flow in the bars or ringers. Current flows transverse to the long dimension of the bars except perhaps in the case of the two outside bars. Thus, the electrical resistance and inductance of the bars is much smaller than for the interdigital array where the current must flow along the fingers.

Should two bars be shorted together in the grating transducer, only one gap is eliminated from that array, whereas a short between two fingers in the interdigital transducer effectively shorts all the gaps in the array. This is an extremely important technological advance for surface acoustic wave transducers since, such shorts are quite likely to occur in arrays having finger and gap dimensions of less than 1 micrometer.

A more quantitative comparison between grating and interdigital transducers can be made by assuming that both types of transducers are described by a crossed-field circuit model. The validity of this analysis is explained in an article by W.R. Smith et al. entitled "Analysis of Interdigital Surface Wave Transducers by Use of an Equivalent Circuit Model," published in the IEEE Transactions on Microwave Theory and Techniques, Vol. MTT–17, pages 856 – 864 (Nov., 1969).

The approximate expressions derived from this model for the transducer input impedance in synchronism are:

$$\text{Interdigital: } R = (K^2/\pi) \,.\, (1/\omega_o C_s) \tag{1}$$

$$X = 1/(\omega_o N C_s) \tag{2}$$

$$\text{Grating Array: } R = N^2 \,.\, K^2/\pi \,.\, 1/(\omega_o C_s) \tag{3}$$

$$X = N/(\omega_o C_s) \tag{4}$$

where $R$ is the resistance, $X$ is the reactance, $\omega_o$ is the radian frequency at synchronism, $C_s$ is the capacitance per period, $N$ is the number of periods, and $K^2$ is the square of the electromechanical coupling coefficient for surface waves. The capacitance $C_s$ is not quite the same for both cases, but is of the same order of magnitude. Assuming that $K^2$ is the same for both cases, it is seen that the reactance of a grating transducer is $N^2$ times that of an interdigital transducer, whereas the resistance of a grating transducer is $N^2/4$ times the resistance of an interdigital transducer. The factor of 4 is a result of the fact that the grating transducer has only one coupling gap per wavelength instead of two as in the interdigital transducer. Thus the electrical Q of a grating transducer is 4 times the electrical Q of an interdigital transducer. The acoustic Q is equal to $N$ for both types of transducers. Hence the optimum number of periods (when electrical and acoustic Q's are equal) for a grating transducer is twice that for an interdigital transducer and, thus, one may say that the bandwidth of a grating transducer is half that of an interdigital transducer.

It might be argued that a 1 GHz interdigital transducer operated at its third harmonic could be used for 3 GHz operation. This is true except that the electrical Q is porportional to harmonic number and the input resistance is inversely proportional to harmonic number squared. Thus, the transducer would be narrowband and have a low impedance. In addition, an interdigital transducer operated at a higher harmonic tends to generate bulk waves.

Figure 3:
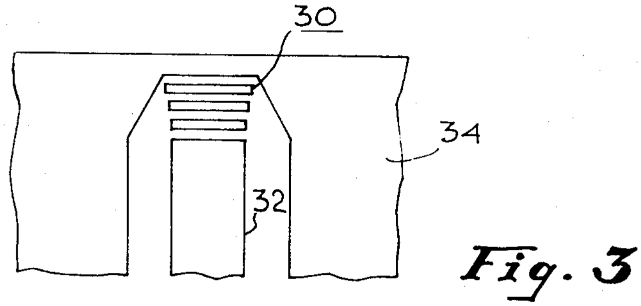
FIG. 3 illustrates how the grating transducer in accordance with this invention may be connected to a coplanar transmission line.

The grating transducer is ideally suited for being connected to a coplanar transmission line. This is illustrated in FIG. 3. This is an important consideration at microwave frequencies when the effects of bond wires can often determine the behavior of the device. The grating transducer 30 is represented by the three fingers. The coplanar transmission line comprises the center conductor 32 spaced from the adjacent outer conductor 34.

Figure 4:
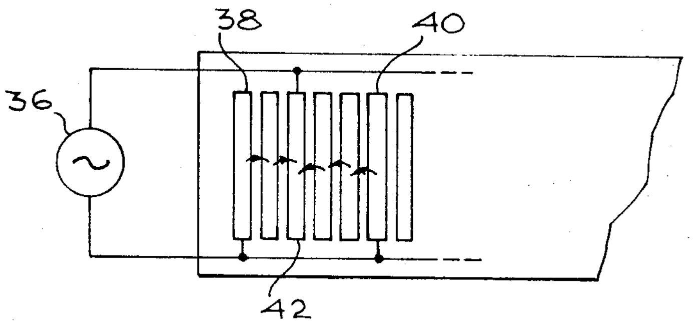
FIG. 4 illustrates how phase reversals may be obtained with a transducer made in accordance with this invention.

If required, phase reversals are easily accomplished with the grating transducer without the need for having a pair of adjacent fingers at the same electric potential. This is illustrated in FIG. 4. Connections from a potential source 36 are not made to the first and last conductors, as shown in FIG. 2, but are made to a first and subsequent conductor 38, 40 respectively, from one side of the potential source, and to an intermediary conductor 42 from the other side of the potential source. As may be seen by the arrows, there is a phase reversal at the intermediary finger.

Some further advantages of the grating transducer in accordance with this invention, over the interdigital transducer are as follows.

There are situations where complicated transducer arrays having many finger pairs are required, e.g., narrow-band frequency filters, matched filters for long PSK codes, and pulse compression filters having large time-bandwidth products. In these cases the impednace level of the array at UHF frequenceis will be quite low if interdigital transducers are used, providing an undesirable situation. On the other hand, the use of grating transducers would provide reasonable impedance levels for these devices. The point is that the grating transducer should be useful for certain applications at frequencies lower than microwave and these applications might be more important than the ones at microwave frequencies.

The grating transducer uses one-half wavelength fingers and one-half wavelength gaps. Therefore, using the same technology, grating transducers are capable of being fabricated for operating frequencies that are twice as large as the operating frequency of a corresponding interdigital transducer.

Since the voltage applied to the grating transducer is divided between all of the gaps, the power handling capabilities of this transducer is greater than for an interdigital transducer.

Many of the devices mentioned above require anodizing (weighting of the signal generated or detected by each finger pair or groups of finger pairs). Anodizing is accomplished with the interdigital transducer by shortening the fingers with respect to the width of the incoming acoustic wavefront, whereas the fingers are lengthened in the case of the grating transducer. Therefore with a grating transducer the incoming beam propagates under a uniform electrode structure, thereby minimizing wavefront distortion.

There has been described above a novel and useful transducer for use with surface acoustic wave devices.

What is claimed is:

1. A surface acoustic wave transducer comprising: a plurality of conductively isolated parallel, elongated, spaced conductors deposited upon only one surface of an acoustic wave transmitting medium, and means for deriving signals from, or applying signals to, non-adjacent ones of said conductors which are upon said one surface of said acoustic wave transmitting medium.

2. A surface acoustic wave transducer as recited in claim 1 wherein the spacing between conductor centers is equal to a multiple of a surface acoustic wavelength at the frequency of operation, and the width of each conductor is equal to one half of an acoustic wavelength at the frequency of operation.

3. A surface acoustic wave transducer as recited in claim 1 wherein said means for deriving from or applying signals to non-adjacent ones of said conductors applies signals to or derives them from a plurality of non-adjacent ones of said conductors.

4. A surface acoustic wave transducer as recited in claim 1 wherein there are a plurality of said isolated spaced conductors between said non-adjacent ones of said conductors to which signals are applied or from which signals are derived by said means.

* * * * *